(12) United States Patent
Fung et al.

(10) Patent No.: US 7,315,048 B2
(45) Date of Patent: Jan. 1, 2008

(54) METHOD AND APPARATUS FOR MIXING LIGHT EMITTED BY A PLURALITY OF SOLID-STATE LIGHT EMITTERS

(75) Inventors: Elizabeth Ching Ling Fung, Bayan Lepas (MY); Thye Linn Mok, Bukit Mertajam (MY); Hong Huat Yeoh, Penang (MY); Yew Cheong Kuan, Penang (MY); Fakhrul Arifin Mohd Afif, Prai Penang (MY); Norfidathul Aizar Abdul Karim, Seberang Perai (MY); Kian Shin Lee, Penang (MY); Hui Peng Koay, Penang (MY)

(73) Assignee: Avago Technologies ECBU IP (Singapore) PTE Ltd, Singapore (SG)

( * ) Notice: Subject to any disclaimer, the term of this patent is extended or adjusted under 35 U.S.C. 154(b) by 190 days.

(21) Appl. No.: 10/971,626

(22) Filed: Oct. 22, 2004

(65) Prior Publication Data

US 2006/0086946 A1   Apr. 27, 2006

(51) Int. Cl.
*H01L 33/00* (2006.01)
(52) U.S. Cl. .................. 257/95; 257/96; 257/97; 257/98; 257/99; 257/100; 257/81; 257/E33.005

(58) Field of Classification Search .......... 257/95–100, 257/81
See application file for complete search history.

(56) References Cited

U.S. PATENT DOCUMENTS

| 4,375,606 | A | * | 3/1983 | Di Leo et al. ............... 313/499 |
| 5,760,754 | A | * | 6/1998 | Amero et al. ................. 345/82 |
| 2003/0202349 | A1 | * | 10/2003 | Suehiro et al. ............. 362/245 |
| 2004/0141336 | A1 | * | 7/2004 | West et al. .................. 362/555 |
| 2006/0097245 | A1 | * | 5/2006 | Aanegola et al. ............. 257/26 |

* cited by examiner

*Primary Examiner*—Lynne Gurley
*Assistant Examiner*—Samuel A Gebremariam

(57) ABSTRACT

In one embodiment, light emitted by a plurality of solid-state light emitters is mixed by mounting the plurality of solid-state light emitters on a transparent to translucent substrate so that they primarily emit light away from the substrate. The light emitters are then covered with a transparent to translucent encapsulant; and the encapsulant is coated with a reflective material that reflects light emitted by the light emitters toward the substrate. Related apparatus is also disclosed.

7 Claims, 5 Drawing Sheets

METHOD AND APPARATUS FOR MIXING LIGHT EMITTED BY A PLURALITY OF SOLID-STATE LIGHT EMITTERS

BACKGROUND

A solid-state light emitter (e.g., a light emitting diode (LED) or laser diode) typically emits a single wavelength of light, the intensity of which can be adjusted by adjusting (e.g., modulating) the emitter's drive current. To generate a light of varying color, or to generate a color of light that corresponds to something other than an emitter's single wavelength of light, two or more different-colored emitters may be positioned such that their emitted light mixes to form yet another color. In some cases, the light emitted by a plurality of different-colored emitters is mixed to form a steady-state color. For example, the light emitted by red, green and blue light emitters is often mixed to generate a white light (sometimes for the purpose of backlighting a display). In other cases, the light emitted by a plurality of different-colored emitters is mixed to generate a series of colors (sometimes for the purpose of generating a pixel of data for a dynamic display). This may be accomplished, for example, by varying the ratios of drive currents supplied to the different emitters.

In both of the above cases, it is typically desired that the light emitted by the different-colored emitters mix to form a uniform light of a different color. However, given that solid-state light emitters are more akin to point light sources than diffuse light sources, a thorough mixing of their light can be difficult to achieve.

SUMMARY OF THE INVENTION

In one embodiment, a method for mixing light emitted by a plurality of solid-state light emitters comprises mounting the plurality of solid-state light emitters on a transparent to translucent substrate such that the light emitters primarily emit light away from the substrate. The light emitters are then covered with a transparent to translucent encapsulant; and the encapsulant is coated with a reflective material that reflects light emitted by the light emitters toward the substrate.

In another embodiment, a device comprises a transparent to translucent substrate having a plurality 6f solid-state light emitters mounted thereon such that they primarily emit light away from the substrate. A transparent to translucent encapsulant covers the light emitters. A reflective coating is applied to a surface of the encapsulant to reflect light emitted by the light emitters toward the substrate.

Other embodiments are also disclosed.

BRIEF DESCRIPTION OF THE DRAWINGS

Illustrative and presently preferred embodiments of the invention are illustrated in the drawings, in which.

DETAILED DESCRIPTION OF AN EMBODIMENT

Figure 1:
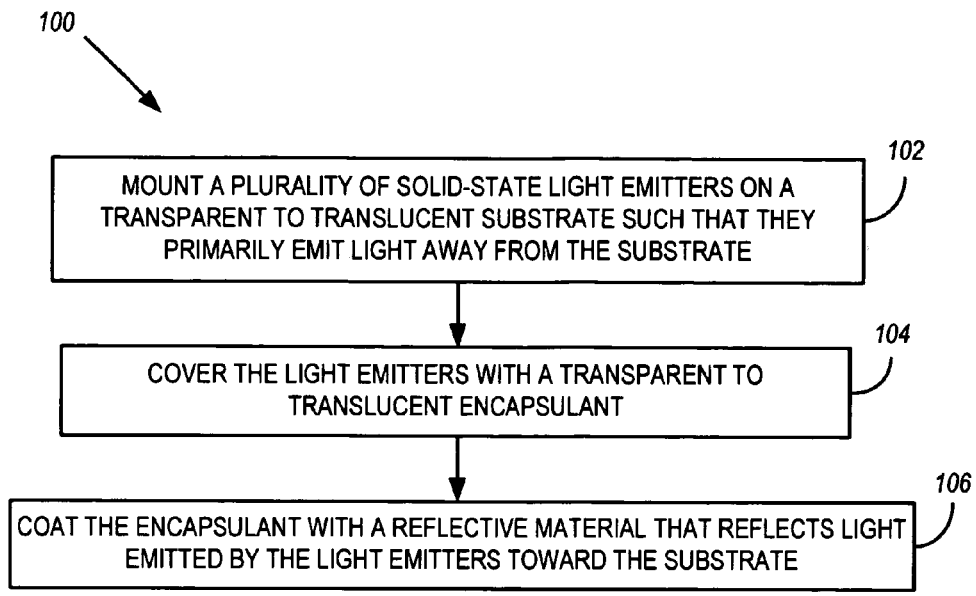
FIG. 1 illustrates an exemplary method for mixing the light emitted by a plurality of solid-state light emitters.

FIG. 1 illustrates an exemplary method 100 for mixing the light emitted by a plurality of solid-state light emitters. In accordance with the method 100, the plurality of solid-state light emitters are mounted 102 on a transparent to translucent substrate such that they primarily emit light away from the substrate. As defined herein, a "transparent to translucent" substrate is a substrate that either allows light to pass unobstructed, or in a diffused fashion.

The method 100 continues with the covering 104 of the light emitters with a transparent to translucent encapsulant. Thereafter, the encapsulant is coated 106 with a reflective material that reflects light emitted by the light emitters toward the substrate.

Figure 2:
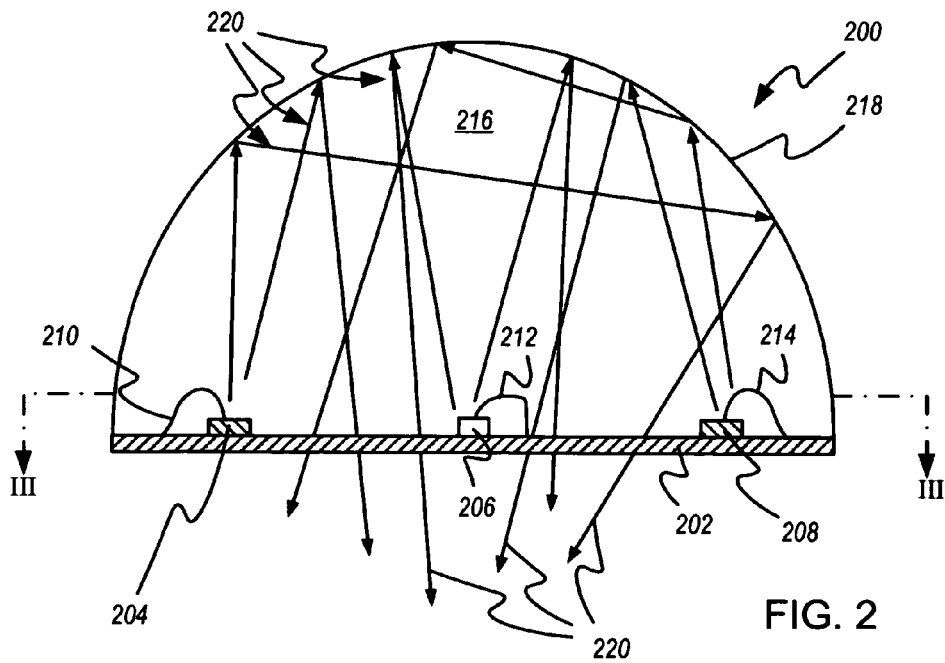
FIG. 2 illustrates an elevation of a first exemplary device that may be formed using the FIG. 1 method.
Figure 3:
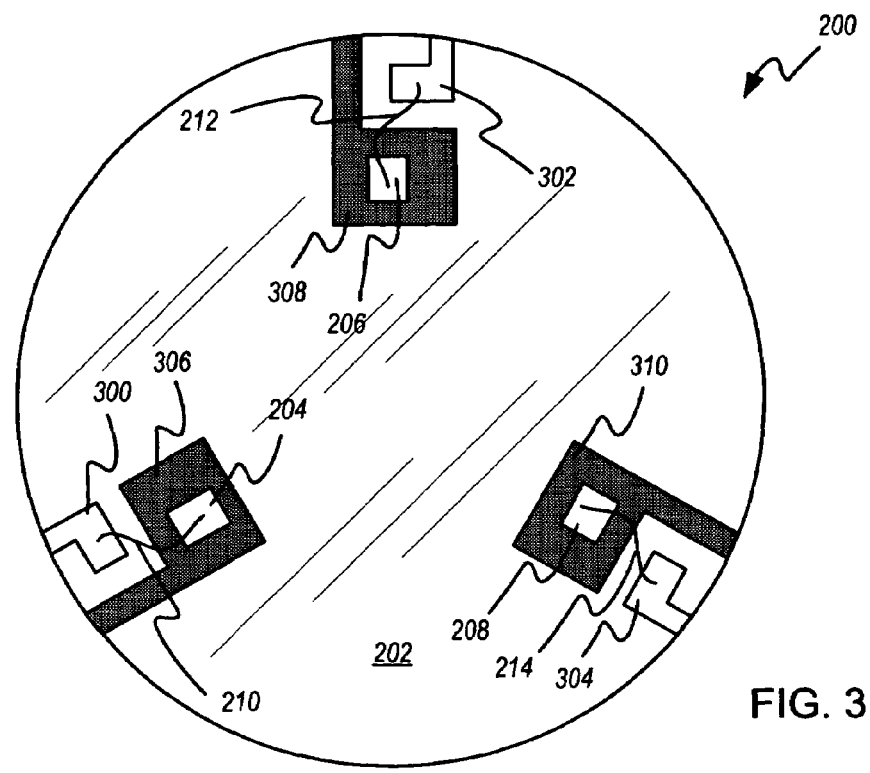
FIG. 3 illustrates a plan view of the FIG. 2 device.

A first exemplary device 200 that may be formed using the method 100 is shown in FIGS. 2 & 3. The device 200 comprises a transparent to translucent substrate 202 that, by way of example, may be formed of silicone gel, epoxy, a resin or glass.

A plurality of solid-state light emitters 204, 206, 208 (e.g., LEDs or laser diodes) are mounted on the substrate 202 such that they primarily emit light away from the substrate 202. As defined herein, a "plurality" of light emitters 204-208 need only comprise two or more light emitters, of any color. However, in the embodiment shown in FIGS. 2 & 3, the light emitters 204-208 comprise a red light emitter 204, a green light emitter 206, and a blue light emitter 208.

The light emitters 204-208 may be mounted on the substrate 202 in a variety of ways. In one embodiment, a plurality of conductors 300, 302, 304, 306, 308, 310 are formed (e.g., painted or plated) on the substrate 202. Each light emitter 204-208 may then be mounted on a first one of the conductors 300-304 and coupled to a second one of the conductors 306-310 via a wire bond 210, 212, 214. In some cases, the conductors 300-304 on which the light emitters 204-208 are mounted may be coupled to one another via a common ground.

An alternate way to mount the light emitters 204-208 on the substrate 202 is to mount the light emitters 204-208 directly on the substrate 202, and then couple the light emitters 204-208 to each of a pair of conductors via wire bonds.

After the light emitters 204-208 are mounted on the substrate 202, they are covered with a transparent or translucent encapsulant 216. In one embodiment, the encapsulant 216 may take the form of a transparent or translucent shell that is secured (e.g., glued or fused) to the substrate 202. By way of example, the shell may be formed using silicone, epoxy or a resin. In another embodiment, the encapsulant 216 may take the form of a liquid, gel or semi-solid material that is dispensed onto the substrate 202 and then cured. Optionally, the substrate 202 may be mated to a mold, and the encapsulant 216 may be dispensed into the mold. In this manner, a variety of surface details may be applied to the encapsulant 216, as will be described later in this description. In yet another embodiment, the light emitters 204-208 may be covered with both of the above-mentioned encapsulants. For example, a soft encapsulant may be placed into an inverted shell, and the shell may then be secured to the substrate 202.

After covering the light emitters 204-208 with the encapsulant 216, a reflective coating 218 is applied to a surface of the encapsulant 216. The reflective coating 218 may be a metallic coating, and in one embodiment is a mirrored coating. In use of the device 200, the reflective coating 218 serves to reflect light 220 emitted by the emitters 204-208 toward the substrate 202.

By directing the light 220 emitted by the emitters 204-208 into the encapsulant 216 before reflecting it out of the substrate 202, the light 220 from the various emitters 204-208 is mixed to a substantially greater degree than if the light were merely emitted directly toward a viewer (or toward a target to be illuminated).

Figure 4:
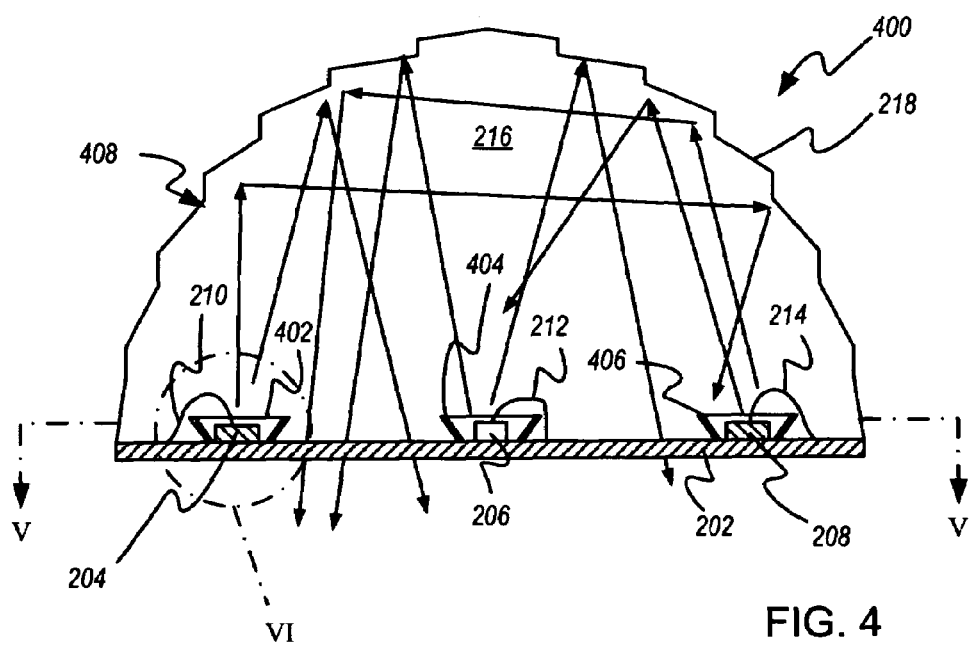
FIG. 4 illustrates an elevation of a second exemplary device that may be formed using the FIG. 1 method.
Figure 5:
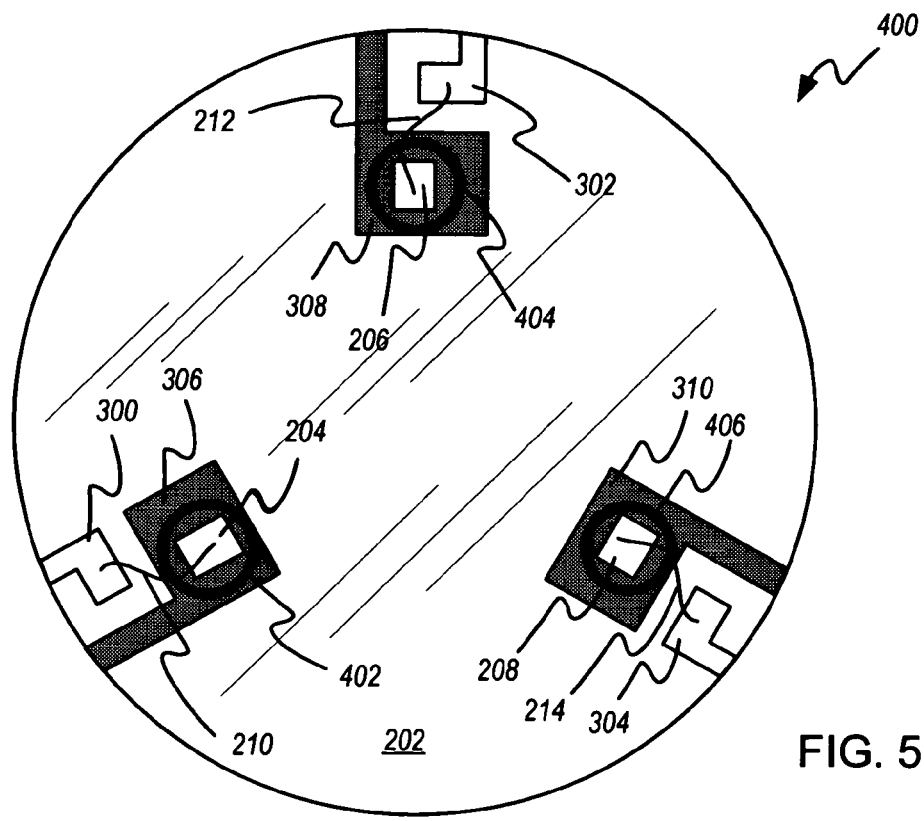
FIG. 5 illustrates a plan view of the FIG. 4 device.
Figure 6:
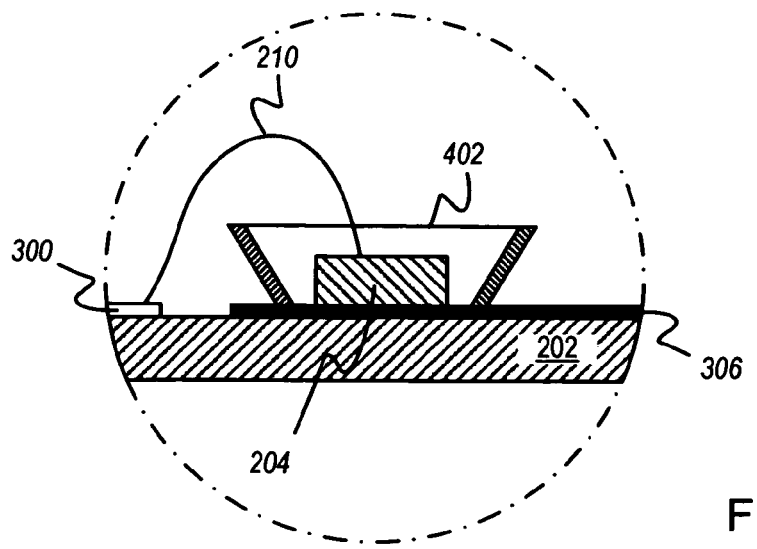
FIG. 6 illustrates an exploded view of a portion of the FIG. 4 device.

To ensure even better mixing of emitted light, the device 200 may be modified in various ways. For example, one or more reflectors may be mounted on the substrate 202 to reflect light emitted by the light emitters 204-208 toward the reflective coating 218 applied to the encapsulant 216. In one embodiment, a single reflector may be positioned near or around the plurality of emitters 204-208. In another embodiment, and as shown in FIGS. 4-6 (in device 400), the reflectors may take the form of reflector cups 402, 404, 406 that surround each of the light emitters 204-208.

The surface of the encapsulant 216 to which the reflective coating 218 is applied may be generally dome-shaped, as shown in FIG. 2. Alternately, it may be textured (e.g., randomly roughened) or faceted. As shown in FIG. 4, a lens 408 may also be formed on the encapsulant 216. One way to form such a lens is via a mold that is abutted to the substrate 202 prior to dispensing an encapsulant 216 into the mold. In some cases, the mold may be a shell encapsulant, as previously discussed. By way of example, the lens 408 shown in FIG. 4 is a Fresnel lens, although other types of lenses might also be useful.

A lens may also be formed on (e.g., molded into) the substrate. By way of example, the lens could be concave or convex.

A textured or faceted encapsulant surface, or an encapsulant 216 or substrate 202 having a lens 408 formed thereon, may be especially useful to encourage light mixing when the encapsulant 216 and substrate 202 are transparent. If the encapsulant 216 or substrate 202 is translucent, the encapsulant 216 or substrate 202 itself may provide enough light mixing.

The substance of the substrate 202 or encapsulant 216 may also be modified to improve light mixing. For example, impurities or reflective powders, such as a diffusant may be introduced into the substrate 202 or encapsulant 216. The substrate 202 or encapsulant 216 may also be tinted, or may have a light polarizer formed therein or thereon.

Figure 7:
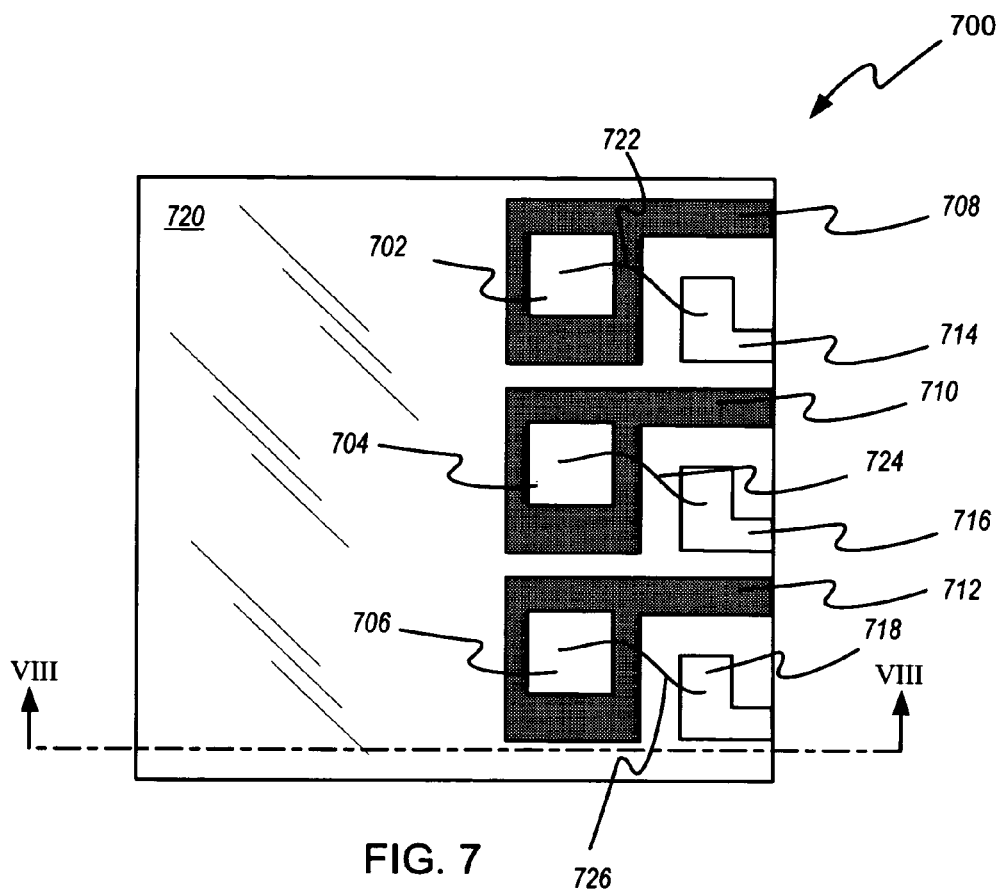
FIG. 7 illustrates an exemplary mounting of light emitters on a rectangular transparent or translucent substrate.

As shown in FIGS. 3 & 5, a plurality of light emitters 202-206 may be evenly spaced about a circular circumference. However, the emitters 202-206 may also be arranged in alternate ways. For example, FIG. 7 shows a plan view of a device 700 wherein its light emitters 702, 704, 706 are mounted in a row. By way of example, the light emitters 702-706 are shown to be mounted to first and second conductors 708, 710, 712, 714, 716, 718 formed on a substrate 720. Similarly to the device 200, the emitters 702-706 may be mounted on first ones of the conductors 708-712, and then wire bonded to second ones of the conductors 714-718 (via wire bonds 722, 724, 726).

The geometry of the substrates 202 shown in FIGS. 3 & 5 are circular, whereas the geometry of the substrate 720 shown in FIG. 7 is rectangular. Alternately, the geometry of a transparent or translucent substrate may take other forms, depending on preference, manufacturing requirements, or the needs of a particular application.

Figure 8:
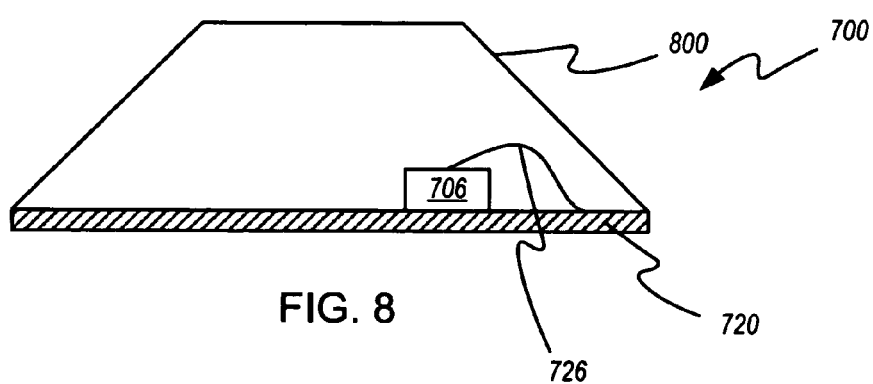
FIG. 8 illustrates an exemplary trapezoidal profile for the encapsulant of the FIG. 7 device.

Although the cross-section of the encapsulant 216 shown in FIG. 2 is generally dome-shaped, the cross-section of an encapsulant may take other forms. For example, FIG. 8 illustrates a trapezoidal (or faceted) profile 800.

Figure 9:
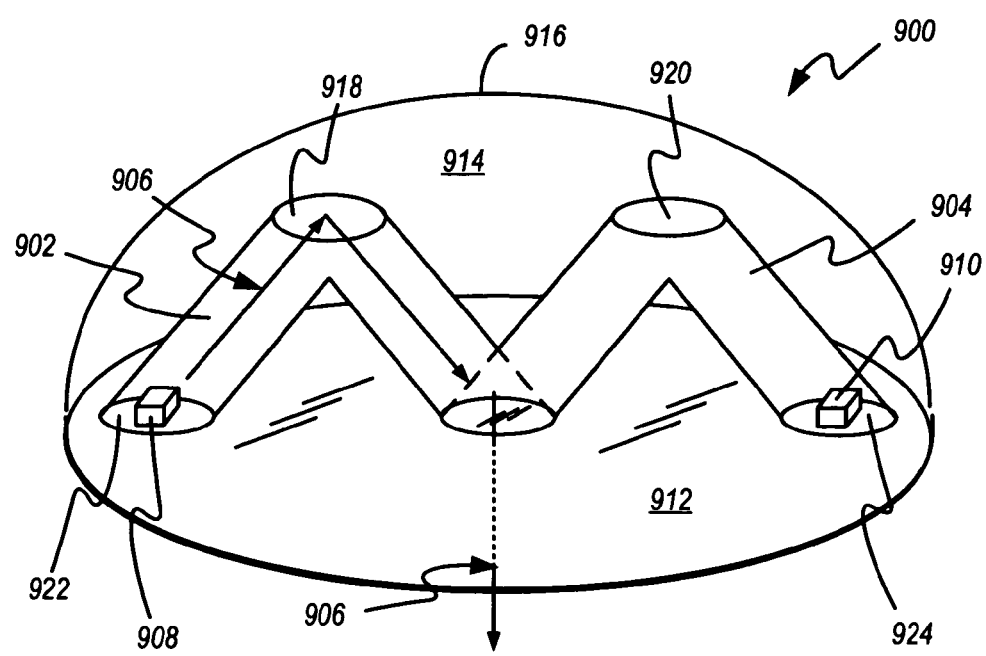
FIG. 9 illustrates an isometric view of a third exemplary device that may be formed using the FIG. 1 method.

FIG. 9 illustrates yet another device 900 that may be formed using the method 100. The device 900 comprises a plurality of transparent to translucent light pipes 902, 904 that are positioned to redirect light 906 emitted by a plurality of light emitters 908, 910 mounted on a transparent to translucent substrate 912. The light pipes 902, 904 provide for light mixing, but also do so in a more controlled way. Although the light pipes 902, 904 may carry the majority of light 906 that is emitted by the light emitters 908, 910, the light pipes 902, 904 are also encapsulated by an encapsulant 914 having a reflective coating 916 thereon. Preferably, the light pipes 902, 904 have higher refractive indexes than the encapsulant 914. In one embodiment, the light pipes 902, 904 are formed from a second encapsulant. In another embodiment, the light pipes 902, 904 comprise fiber optic strands, or glass structures printed with a reflective material, that are suspended above the light emitters 908, 910 as the first encapsulant 914 is molded around them.

If the light pipes 902, 904 comprise bends, a reflector 916, 918 may be positioned at each bend to mitigate the escape of light 906 from the light pipes 902, 904 at the bends. Reflectors 922, 924 may also be provided around each light emitter 908, 910. Light that does escape the light pipes 902, 904 is reflected by the coating 916 on the encapsulant 914, as previously described.

The devices disclosed 200, 400, 900 herein may be used in various applications. In some applications, they may be installed over holes in printed circuit boards.

What is claimed is:

1. A device, comprising:
    a transparent to translucent substrate comprising front and back surfaces:
    a plurality of solid-state light emitters mounted on the back surface of the substrate such that the light emitters emit light primarily rearwardly away from the back surface:
    a transparent to translucent encapsulant encapsulating and covering the light emitters, the encapsulant being configured to form a rounded outer surface disposed rearwardly from the light emitters and the back surface, the outer surface being at least one of roughened, faceted and textured;
    a reflective coating applied to the outer surface of the encapsulant and configured to reflect light emitted by the plurality of light emitters substantially in a forward direction towards the substrate and then therethrough: and
    a plurality of light reflectors, one reflector for each of the plurality of light emitters, each reflector being operatively disposed between the rear surface of the substrate and a corresponding one of the light emitters, each reflector being configured to reflect light emitted by its corresponding light emitter towards the reflective coating.

2. The device of claim 1, wherein each of the reflectors is a reflector cup.

3. The device of claim 1, wherein the plurality of solid state light emitters includes at least one of a red light emitter, a blue light emitter and a green light emitter.

4. The device of claim 1, further comprising at least one light pipe operatively associated with at least one of the plurality of light emitters to capture and direct light emitted thereby in the direction of the substrate.

5. The device of claim 4, wherein the at least one light pipe has a higher index of refraction greater than the encapsulant.

6. The device of claim 4, wherein the at least one light pipe is formed from a second encapsulant.

7. The device of claim 4, wherein the at least one light pipe comprises a bend and a light pipe reflector associated therewith positioned to mitigate the escape of light from the at least one light pipe.

* * * * *

UNITED STATES PATENT AND TRADEMARK OFFICE
CERTIFICATE OF CORRECTION

PATENT NO. : 7,315,048 B2
APPLICATION NO. : 10/971626
DATED : January 1, 2008
INVENTOR(S) : Elizabeth Ching Ling Fung et al.

It is certified that error appears in the above-identified patent and that said Letters Patent is hereby corrected as shown below:

Column 4, Line 42, Claim 1, delete "surfaces:" and insert -- surfaces; --;

Column 4, Line 46, (Approx.), Claim 1, delete "surface:" and insert -- surface; --;

Column 4, Line 57, (Approx.), Claim 1, delete "therethrough:" and insert -- therethrough; --.

Signed and Sealed this

Second Day of November, 2010

David J. Kappos
*Director of the United States Patent and Trademark Office*